United States Patent [19]

Villa

[11] Patent Number: 5,045,910

[45] Date of Patent: Sep. 3, 1991

[54] INTEGRATED POWER TRANSISTOR COMPRISING MEANS FOR REDUCING THERMAL STRESSES

[75] Inventor: Flavio Villa, Milan, Italy

[73] Assignee: SGS-Thomson Microelectronics S.r.l., Agrate Brianza, Italy

[21] Appl. No.: 381,340

[22] Filed: Jul. 17, 1989

[30] Foreign Application Priority Data

Jul. 29, 1988 [IT] Italy .................. 21598 A/88

[51] Int. Cl.⁵ .................................. H01L 29/72
[52] U.S. Cl. ............................. 357/35; 357/36; 307/254; 330/257; 330/288
[58] Field of Search ............ 357/36, 35, 45; 307/254, 270; 330/257, 288

[56] References Cited

U.S. PATENT DOCUMENTS

| | | | |
|---|---|---|---|
| 4,085,411 | 4/1978 | Genesi | 357/36 |
| 4,160,986 | 7/1979 | Johnson | 357/36 |
| 4,476,439 | 10/1984 | Sato | 330/288 |
| 4,481,483 | 11/1984 | Kawamura | 330/288 |
| 4,536,662 | 8/1985 | Fujii | 307/270 |
| 4,682,197 | 7/1987 | Villa et al. | 357/36 |
| 4,739,190 | 4/1988 | Alzati et al. | 307/300 |
| 4,886,982 | 12/1989 | Villa et al. | 357/46 |

Primary Examiner—Jerome Jackson, Jr.
Assistant Examiner—Courtney A. Bowers
Attorney, Agent, or Firm—Guido Modiano; Albert Josif

[57] ABSTRACT

An integrated power transistor with reduced sensitivity to thermal stresses and improved resistance to direct secondary breakdown, comprising a plurality of transistors having their emitter regions connected so as to define a common emitter terminal, their collector regions connected so as to define a common collector region, and the same plurality of diodes connected to the respective transistors to form therewith a current mirror circuit, each base of the transistors being connected to the first terminal of a corresponding resistor, the second terminal of the corresponding resistors being connected to a common base.

9 Claims, 1 Drawing Sheet

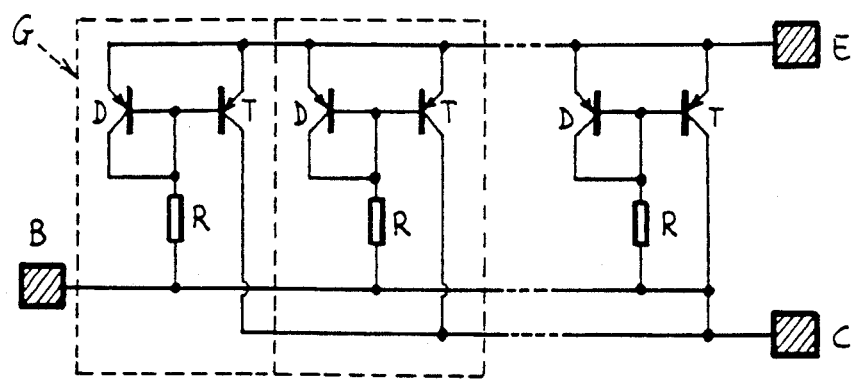
Fig. 1
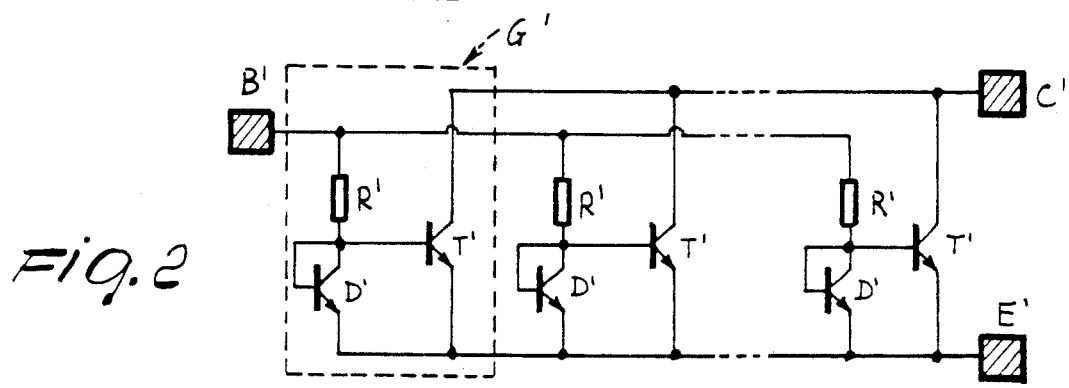
Fig. 2
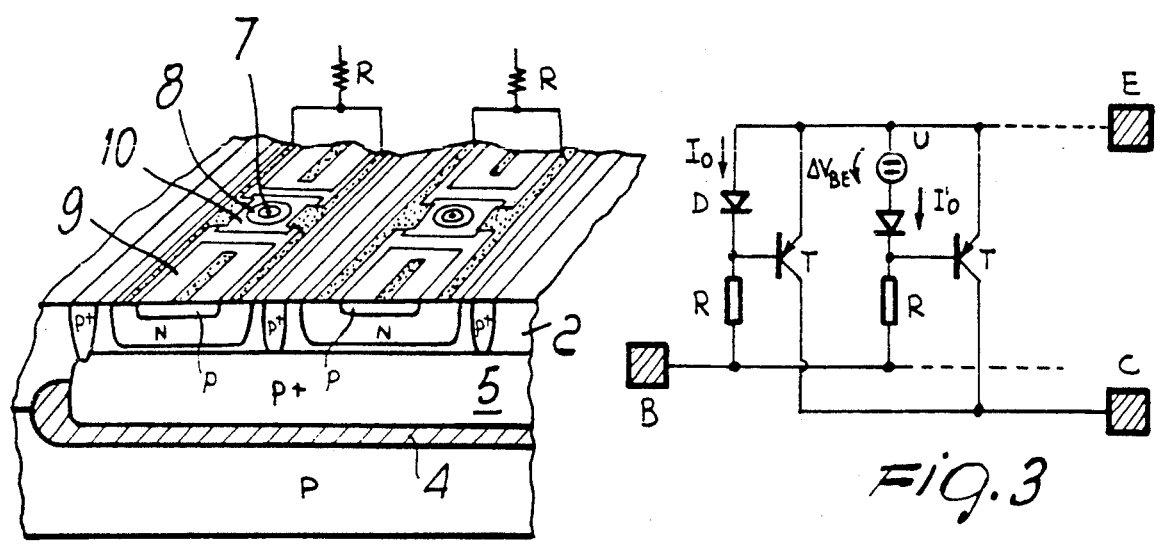
Fig. 3
Fig. 4
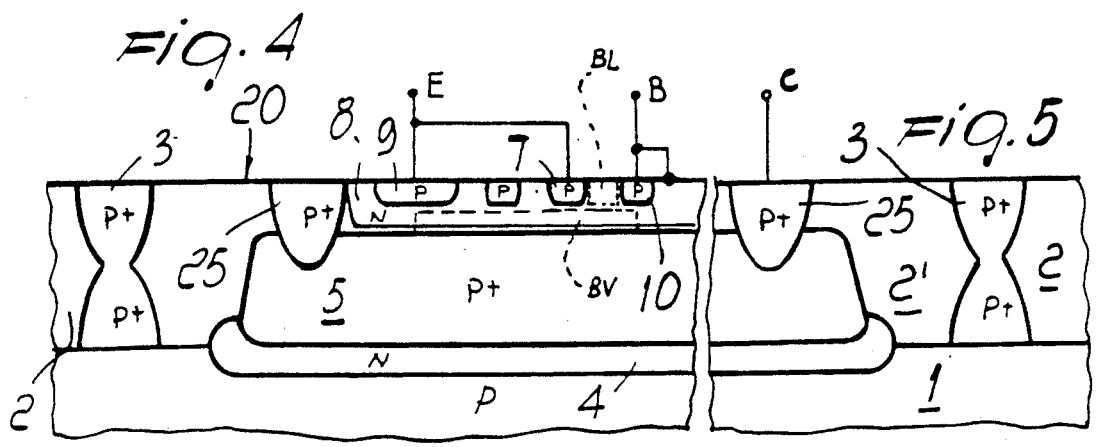
Fig. 5

INTEGRATED POWER TRANSISTOR COMPRISING MEANS FOR REDUCING THERMAL STRESSES

BACKGROUND OF THE INVENTION

The present invention relates to an integrated power transistor comprising means for reducing thermal stresses.

It is known that one of the main problems affecting integrated bipolar power transistors is direct secondary breakdown ($I_{S/B}$). The problem has predominantly thermal causes. Due to the heating of said power transistor, the base-emitter voltage in fact decreases according to a coefficient which depends on the temperature and is in the range of $-2$ mV/° C. Assuming a constant collector current ($I_o$) and the above mentioned temperature coefficient of $-2$ mV/° C., the density of the collector current increases considerably (approximately 10%), causing a localized heating of the power transistor. The increase in the intrinsic temperature is followed by a rapid non-linear increase in said collector current density and by the forming of so-called hot spots which cause meltings in the Al-Si system, with consequent local short circuits in the region between the emitter and the collector of the power transistor and consequently destroy the power transistor itself.

In order to improve the performance of power transistors, some techniques may be adopted to reduce its operating temperature and the thermal gradient on the surface of said power transistors. However, these known techniques are not satisfactory, due to the limitations of the performance of said power transistors, so that all the proposed measures constitute merely a partial solution to the problem of direct secondary breakdown.

A substantial improvement is disclosed in the U.S. patent application Ser. No. 07/135,220, U.S. Pat. No. 4,886,982, in which a power transistor is replaced by a plurality of current mirrors connected in parallel; each of said current mirrors is formed by an output transistor and by a diode with a preset mutual area ratio, so as to obtain an output transistor gain value in the range of 100, while the diode is a stabilizing element which lowers the thermal sensitivity of the collector current of said output transistor.

Each of said current mirrors is driven by a current source.

The reduction factor of the variation of said collector current due to temperature is equal to:

$$1/(1+\beta/(1+m))$$

wherein
m = Area of Transistor/Area of Diode

Implementation of the solution described above entails a buried P+-type region containing, in an intermediate portion thereof, a buried N+-type layer which acts as mirror for the carriers of said current mirror. Such known devices, however, are still susceptible to improvements, especially in order to eliminate the limitation constituted by the low collector-base voltage, which limits the output of the power transistor. An improvement would consist in eliminating the requirement of feeding said current mirrors with perfectly identical collector currents, as this would make the circuit more flexible.

Furthermore, the use of current sources to drive said current mirrors increases the dimensions and complexity of the power transistors described in the above mentioned application, thus leaving room for further improvements from the point of view of further facilitating integration.

In order to produce the above mentioned N+-type buried layer, the P+-type buried layer must furthermore be opened during the chip production process, thus increasing the manufacture complexity and costs.

SUMMARY OF THE INVENTION

Therefore, the aim of the present invention is to provide an integrated power transistor which has improved performance and low sensitivity to thermal stresses and is in particular considerably improved with respect to the known art.

Within this aim, a particular object of the present invention is to provide an integrated power transistor which has simple driving means adapted to prevent the forming of hot spots on the surface of the integrated power transistor itself.

A further object of the invention is to provide a single driving means for the power transistor.

A further object of the present invention is to provide an integrated power transistor able to operate at a high collector-base voltage.

The above described aim and objects and others which will become apparent hereinafter are achieved by an integrated power transistor having the characteristics indicated in claim 1.

BRIEF DESCRIPTION OF THE DRAWINGS

The characteristics and advantages of the invention will become apparent from the following detailed description of currently preferred but non-exclusive embodiments of the invention, illustrated only by way of non-limitative example in the accompanying drawings, wherein:

FIG. 1 is a circuit diagram of an embodiment of a PNP power transistor according to the present invention;

FIG. 2 is a circuit diagram of a further embodiment of an NPN power transistor;

FIG. 3 is a circuit diagram, equivalent to the one illustrated in FIG. 1, with the thermal drift voltage represented as a voltage source $\Delta V_{BE}$;

FIG. 4 is a cross-sectional perspective view of a silicon wafer, implementing a PNP-type cell such as the one illustrated in FIG. 1; and FIG. 5 is a cross-sectional view of the silicon wafer implementing the PNP current mirror cell of FIG. 1 taken along a perpendicular plane with respect to FIG. 4.

DESCRIPTION OF THE PREFERRED EMBODIMENTS

With reference to FIGS. 1 and 2, said figures illustrate different embodiments of the present invention.

More specifically, FIG. 1 illustrates a PNP-type embodiment of an integrated power transistor which comprises a plurality of cells, each whereof is indicated by the reference letter G.

FIG. 2 instead illustrates an NPN-type embodiment of an integrated power transistor, comprising a plurality of cells, each whereof is indicated by the reference letter G'.

As can be seen from FIGS. 1 and 2, the driving means, which define current sources (well-known in the art have been implemented by resistor means R respectively R'.

In the NPN-type embodiment (FIG. 2), which comprises mutually connected cells, each cell G' comprises a current mirror, including a diode D', an output transistor T' (of the NPN type), and a driving means comprising the resistor R'. As can be seen, the bases of the transistor and diode of each current mirror are connected to each other and, by means of the resistor R', to a common base terminal B'; the collectors of the output transistors T' are connected to each other and form a common collector terminal C', and the emitters of said output transistors T' are also connected to each other and form a common emitter terminal E'.

The circuit illustrated in FIG. 2 can be easily implemented by arranging said transistor T' and said diode D' in two adjacent but mutually isolated epitaxial tubs, as is known in the art.

The circuit illustrated in FIG. 1 is a PNP version according to the present invention, and comprises mutually connected cells; each cell G comprises a current mirror including a diode D and an output transistor T of the PNP type, and the driving means defining resistor R. The bases of the transistor and diode of each mirror are connected together and, through said resistor R, to a common terminal B; the collectors of output transistors T are connected together and form a common collector terminal C; the emitters of said output transistors T are connected together and form a common emitter terminal E.

The voltage due to the temperature drift caused by the asymmetry of two adjacent cells is indicated by $\Delta V_{BE}$ and has been simulated in FIG. 3 by means of a voltage source U. Due to said asymmetry, the currents $I_o$ and $I'_o$ of the diodes are not equal. The balance equation of the network is as follows:

$$I'_o \cdot R + I'_o r_D + \Delta V_{BE} = I_o \cdot R + r_D I_o$$

where $$r_D = \frac{V_T}{I_o}$$

is the differential resistance of the diode D; (with $V_T$ being the volt-equivalent of temperature, defined by $V_T \equiv KT/q$) thus $$\Delta V_{BE} = I_o(R + r_D) - I'_o(R + r_D)$$

$$\Delta V_{BE} = (R + r_D)\Delta I_o \text{ with } \Delta I_o = I_o - I'_o$$

and accordingly $$\Delta I_o = \frac{\Delta V_{BE}}{r_D + R} = \frac{\Delta V_{BE}}{r_D} \cdot \frac{1}{1 + \frac{R}{r_D}}$$

The percent mismatching of the current $I_o$ and $I'_o$ is equal to $$\frac{\Delta I_o}{I_o} = \frac{\Delta V_{BE}}{V_T} \cdot \frac{1}{1 + \frac{R}{r_D}}$$

therefore the reduction factor of said percent mismatching is equal to:

$$\frac{1}{1 + \frac{R}{r_D}}$$

If the ratio $R/r_D$ is high, then the temperature difference of the asymmetrically heated branches tends to equalize, and $\Delta V_{BE}$ tends towards zero. Therefore the base currents in each cell tend to become equal.

If the current source means illustrated in the above mentioned U.S. patent application are replaced with the resistor means of the present invention, a simpler and higher integration of said power transistors can be achieved.

FIG. 4 is a perspective view of said integration on a PNP-type silicon wafer. A more detailed view of the integrated structure of the PNP-type current mirror included in each cell is illustrated in FIG. 5.

The silicon wafer comprises a P-type substrate 1 and an N-type epitaxial layer 2 defining a transistor main face 20; a P$^+$-type region 3 isolates, in said epitaxial layer 2, an epitaxial pocket 2' extending from the substrate 1 up to the face 20; the wafer further accommodates an N-type bottom well 4 and a P$^+$-type buried region 5 which forms the collector of the output transistor T connected to the main face through contact regions 25 of the P$^+$-type.

A top N-type well region 8 is defined inside the epitaxial pocket 2', and accommodates a further P-type region 9 and defines the base BV of the transistor T.

The transistor T has a vertical PNP structure, the base whereof is accommodated in the N-well region 8; its emitter is formed by the further P-type region 9, and its collector is formed by said P$^+$-type region 5.

The transistor which defines the diode D comprises a lateral PNP transistor accommodated in the vertical PNP transistor. The diode defining transistor has the base indicated by BL; a first P-type layer 10 forms its collector, and a second P-type layer 7 forms its emitter. The base BL of the transistor which defines the diode D is defined in the N-well region 8. During the production process of the device, the top N-well region 8 implanted on the surface of the silicon wafer diffuses into the bulk of said semiconductor, and since the resulting doping profile is Gaussian, the doping level of the base BL of the transistor which defines the diode D is consequently higher than the doping level of the base BV of the transistor T.

The charge QBL (corresponding to said base BL) is consequently greater than the charge $Q_{BV}$ (corresponding to said base BV).

Since the diode operates under high-injection conditions, the gain $\beta_L$ of the lateral transistor which forms the diode D, the base whereof is BL, is higher than the gain $\beta V$ of the vertical transistor T, the base whereof is BV.

The arrangement described above is obtained without resorting to steps such as for example for opening the P$^+$-type buried region 5 below the lateral PNP region which forms the diode D and for forming an N$^+$ buried layer, as is known in the art. Said $Q_{BL}$ allows the region BV to be shaped before shaping the region BL, and therefore further simplifies the implementation of the power transistor on the silicon wafer.

As is clear from the preceding description, the invention fully achieves the intended aim and objects.

An integrated power transistor structure has in fact been obtained which limits the drift of the collector current which depends on the temperature, thus reducing the risk of a possible direct secondary breakdown, by using resistor means to drive a current mirror.

In addition, by virtue of the structure taught herein, it is possible to obtain much higher base-collector voltages for said power transistor, thus improving the output power with respect to conventional power transistor structures.

Finally, the manufacture of the power transistor according to the invention is simple, and said transistor has a relatively lower cost than comparable known power transistors, has a simple structural arrangement and can be manufactured with process steps which are conventional in the electronics industry.

The invention thus conceived is susceptible to numerous modifications and variations, all of which are within the scope of the inventive concept. In particular, the resistor means may be either integrated or external to the integrated circuit, and the diode of the current mirror may also be formed by any conventional means capable of providing an appropriate PN junction.

The details may naturally be replaced with other technically equivalent elements.

I claim:

1. An integrated power transistor comprising:
   a plurality of transistor means having emitter regions which are mutually connected and define a common emitter terminal, collector regions which are mutually short-circuited and define a common collector terminal, and base regions which are mutually connected and define a common base terminal,
   a plurality of diode means including a diode means associated to each said transistor means, each said diode means being connected between the base and emitter regions of a respective transistor means of said plurality of transistor means and forming therewith a current mirror circuit, and
   a plurality of resistors, each of said resistors being interposed between the base region of a respective transistor means and said common base terminal.

2. An integrated power transistor according to claim 1, wherein said respective transistor means means is of the NPN type and each of said diode means has an anode connected to said base region of said respective transistor means and a cathode connected to said emitter region of said respective transistor means to form with each of said transistors a current mirror circuit.

3. An integrated power transistor according to claim 1, wherein each of said transistor means is of the PNP type and each of said diode means has a cathode connected to said base region of said respective transistor means and an anode connected to said emitter region of said respective transistor means to form with said respective transistor means a current mirror circuit.

4. An integrated power transistor according to claim 2, wherein each of said diode means is formed by an NPN transistor having base and collector regions mutually short-circuited.

5. An integrated power transistor according to claim 3, wherein each of said diode means is formed by a PNP transistor having own base and collector regions mutually short-circuited, said own base region of said diode means and said base region of said respective transistor means defining a common base implemented in a single N-well region.

6. An integrated power transistor comprising:
   a plurality of transistor means having emitter regions which are mutually connected and define a common emitter terminal, collector regions which are mutually short-circuited and define a common collector terminal, and base regions which are mutually connected and define a common base terminal,
   a plurality of diode means, each of said diode means being connected between the base and emitter regions of a respective transistor means of said plurality of transistor means and forming therewith a current mirror circuit, and
   a plurality of resistors, each of said resistors being interposed between the base region of a respective transistor means and said common base terminal,
   wherein each of said transistor means is of the PNP type and each of said diode means has a cathode connected to said base region of said respective transistor means and an anode connected to said emitter region of said respective transistor means to form with said respective transistor means a current mirror circuit,
   each of said diode means being formed by a PNP transistor having own base and collector regions mutually short-circuited, said own base region of said diode means and said base region of said respective transistor means defining a common base implemented in a single N-well region,
   wherein said common base has a Gaussian doping profile with said own base region of each of said diode means being more heavily doped than said base region of said respective transistor means.

7. An integrated power transistor according to claim 1, wherein each of said current mirror circuits is provided according to bipolar technology, a single drive being provided for said current mirror circuits, said drive comprising said resistors.

8. An integrated power transistor comprising a plurality cells, each cell including a transistor means having emitter, base and collector regions; a diode means connected between said base and emitter regions of said transistor means and forming therewith a current mirror circuit; and a resistor having a first terminal connected to said base region of said transistor means and a second terminal, the emitter regions of the transistor means of said plurality of cells being mutually connected and defining a common emitter terminal, the collector regions of the transistor means of said plurality of cells being mutually short-circuited and defining a common collector terminal and the second terminals of the resistors of said plurality of cells being mutually short-circuited and defining a common base terminal.

9. An integrated power transistor comprising:
   a plurality of transistor means having emitter regions which are mutually connected and define a common emitter terminal, collector regions which are mutually short-circuited and define a common collector terminal, and base regions which are mutually connected and define a common base terminal,
   a plurality of diode means, each of said diode means being connected between the base and emitter regions of a respective transistor means of said plurality of transistor means and forming therewith a current mirror circuit, and
   a plurality of resistors, each of said resistors being interposed between the base region of a respective transistor means and said common base terminal,
   wherein each of said transistor means is of the PNP type and each of said diode means has a cathode connected to said base region of said respective transistor means and an anode connected to said emitter region of said respective transistor means to form with said respective transistor means a current mirror circuit, each of said diode means being formed by a PNP transistor having own base and collector regions mutually short-circuited, said own base region of said diode means and said base region of said respective transistor means defining a common base implemented in a single N-well region, said integrated power transistor further comprising a substrate of the P conductivity type, an epitaxial layer of the N conductivity type superimposed to said substrate and defining a transistor main face, isolation regions of the P conductivity type extending from said substrate up to said transistor main face and isolating, in said epitaxial layer, at least one epitaxial pocket, a well layer of the N conductivity type extending between said substrate and said epitaxial pocket, a buried layer of the P conductivity type extending in said epitaxial pocket and being superimposed to said well layer, said buried layer defining a collector region of said transistor means, contact regions of the P conductivity type extending from said buried layer up to said transistor main face, said buried layer and said contact regions laterally delimiting an epitaxial well region in said epitaxial pocket, said epitaxial well region defining said common base, a first region of the P conductivity type extending in said epitaxial well region from said transistor main face and defining an emitter region of said transistor means, a second region of the P conductivity type extending in said epitaxial well region from said transistor main face adjacent to and spaced apart from said first region and defining said own collector region of said diode means, a third region of the P conductivity type extending in said epitaxial well region from said transistor main face adjacent to and spaced apart from said second region and defining an emitter region of said diode means, and short-circuit means connecting said own collector region and said common base region of said diode means.

* * * * *